(12) United States Patent
Gu et al.

(10) Patent No.: US 10,658,534 B2
(45) Date of Patent: May 19, 2020

(54) BI-FACIAL PHOTOVOLTAIC POWER GENERATION MODULE

(71) Applicants: Jinjie Gu, Zhejiang (CN); Shuqin Wang, Zhejiang (CN); Letian Gu, Zhejiang (CN)

(72) Inventors: Jinjie Gu, Zhejiang (CN); Shuqin Wang, Zhejiang (CN); Letian Gu, Zhejiang (CN)

(*) Notice: Subject to any disclaimer, the term of this patent is extended or adjusted under 35 U.S.C. 154(b) by 0 days.

(21) Appl. No.: 16/264,648

(22) Filed: Jan. 31, 2019

(65) Prior Publication Data

US 2019/0165195 A1    May 30, 2019

(51) Int. Cl.

| | |
|---|---|
| *H01L 31/0465* | (2014.01) |
| *H01L 31/0203* | (2014.01) |
| *H01L 31/042* | (2014.01) |
| *H01L 31/048* | (2014.01) |
| *H01L 31/068* | (2012.01) |
| *H01L 31/028* | (2006.01) |
| *H01L 31/052* | (2014.01) |
| *H01L 31/0216* | (2014.01) |
| *H01L 31/054* | (2014.01) |
| *H01L 31/075* | (2012.01) |
| *H01L 31/0224* | (2006.01) |
| *H01L 31/02* | (2006.01) |

(52) U.S. Cl.
CPC ........ *H01L 31/0465* (2014.12); *H01L 31/028* (2013.01); *H01L 31/02013* (2013.01); *H01L 31/02168* (2013.01); *H01L 31/022425* (2013.01); *H01L 31/042* (2013.01); *H01L 31/054* (2014.12); *H01L 31/0521* (2013.01); *H01L 31/0543* (2014.12); *H01L 31/0684* (2013.01); *H01L 31/075* (2013.01)

(58) Field of Classification Search
CPC ............ H01L 31/0465; H01L 31/0203; H01L 31/0216; H01L 31/022425; H01L 31/028; H01L 31/042; H01L 31/048; H01L 31/0488; H01L 31/0684; H01L 31/075
See application file for complete search history.

(56) References Cited

U.S. PATENT DOCUMENTS

| | | | | |
|---|---|---|---|---|
| 4,352,948 | A * | 10/1982 | Kaplow | .......... H01L 31/035281 136/246 |
| 2014/0256078 | A1 * | 9/2014 | Jin | ...................... B81C 1/00515 438/57 |
| 2017/0176051 | A1 * | 6/2017 | Potter | .................. B65G 49/063 |
| 2018/0315871 | A1 * | 11/2018 | Curran | .................. H01L 27/302 |

* cited by examiner

*Primary Examiner* — Susan D Leong

(57) ABSTRACT

The present invention discloses a bi-facial photovoltaic power generation module, comprising a transparent box, and a cell string and a mounting base which are installed inside the transparent box, wherein the transparent box is provided with a positive terminal and a negative terminal, the cell string is formed by connecting several bi-facial cells in series or in parallel with both ends of the cell string respectively provided with a positive wire and a negative wire welded on the positive terminal and the negative terminal, and the mounting base is provided with strip-shaped slots in which the bi-facial cells can be plugged. According to the present invention, the module can simultaneously generate power on front and back sides thereof and improve its power generation efficiency per unit area.

9 Claims, 3 Drawing Sheets

BI-FACIAL PHOTOVOLTAIC POWER GENERATION MODULE

BACKGROUND OF THE INVENTION

The present invention relates to the technical field of solar power generation, in particular to a bi-facial photovoltaic power generation module.

Under the background of increasingly serious energy shortage and environmental pollution, the development of renewable energy has become a major global issue. Solar cells, also known as "solar chips" or "photocells", are photoelectric semiconductor chips that generate electricity directly by making use of the sunlight. As long as such solar cell is illuminated under certain illumination conditions, it can output voltage in an instant and generate current in the case of a circuit. Therefore, the use of solar energy is an important direction for developing renewable energy sources. However, the higher production cost restricts its application scope. With the drastic reduction of government subsidies, it is an urgent problem for all manufacturers to reduce the production cost of cells and improve the power generation efficiency.

With the development of photovoltaic market, people's demand for high-efficiency crystalline silicon solar cells is becoming more and more urgent. More than 85% of the commercial solar cell market is still occupied by crystalline silicon solar cell products, and the cost-performance competition around efficiency and cost is very fierce. Monocrystalline silicon solar cells are mainly made of P-type and N-type substrates. Due to the cost advantages in substrate price and non-silicon cost, the current main market products are still P-type monocrystalline silicon solar cells. Compared with P-type crystalline silicon cells, N-type crystalline silicon has a large diffusion length in its minority carriers because it is insensitive to metal impurities or has good endurance. In addition, the N-type crystalline silicon is doped with phosphorus without formation of cell string-O complex due to illumination, so there is no light-induced deterioration in the P-type crystalline silicon cell. Therefore, the N-type crystalline silicon cells have gradually become the focus of many research institutions and photovoltaic enterprises.

Meanwhile, with the increasing global installed capacity of solar energy, there is less and less photovoltaic land available. In the market, it is more and more urgent to improve the power generation efficiency of photovoltaic modules, reduce the cost per kilowatt hour of the electricity generated by the photovoltaic modules, and improve the return on investment of photovoltaic system power stations. At present, all photovoltaic modules generate electricity through cells at front sides thereof, the power of a single cell is only 3 watts, and the power generation efficiency is relatively low.

BRIEF SUMMARY OF THE INVENTION

In order to solve the above problems, the present invention provides a bi-facial photovoltaic power generation module, which simultaneously generates power on front and back sides thereof and improves the power generation efficiency of the module per unit area.

In order to achieve the above objective, a technical solution employed in the present invention is as follows: a bi-facial photovoltaic power generation module is provided, including a transparent box, and a cell string and a mounting base which are installed inside the transparent box, wherein the transparent box is internally provided with a positive terminal and a negative terminal passing through two side faces of the transparent box, respectively, the cell string is formed by connecting several N-type bi-facial monocrystalline silicon cells in series or in parallel, with one end of the cell string connected to a positive wire and the other end thereof connected to a negative wire; the positive wire is welded on the positive terminal and the negative wire is welded on the negative terminal; and the mounting base is provided with several parallel strip-shaped slots in which the N-type bi-facial monocrystalline silicon cells are vertically plugged.

The transparent box is made of tempered glass.

The transparent box is provided with an extractor vent connected to an air extractor.

A transparent self-cleaning coating layer is coated on each outer surface of the transparent box.

A space between the strip-shaped slots is 2 mm.

Several L-shaped light guides, of which an opening at one end faces upward and an opening at the other end thereof is fixedly connected to a side face of the transparent box, are arranged on the side surface of the transparent box.

A bare optical fiber tube bundle which consists of several bare optical fiber tubes with a diameter of 0.2-2 mm is also arranged between the N-type bi-facial monocrystalline silicon cells, and the bare optical fiber tubes are vertically fixed on the mounting base.

A layer of reflective film is arranged on an upper surface of the mounting base.

Each N-type bi-facial monocrystalline silicon cell includes an N-type monocrystalline silicon wafer, having an n+ type crystalline silicon layer, a front passivation anti-reflection layer, and a front metal electrode which is in contact with the n+ type crystalline silicon layer after penetrating the front passivation anti-reflection layer successively superposed on a front side thereof from inside to outside, and a p++ type silicon film layer, an n++ type silicon film layer, a back passivation anti-reflection layer, and a back metal electrode which is in contact with the n++ type silicon film layer after penetrating the back passivation anti-reflection layer successively superposed on a back side thereof from inside to outside.

The present invention has the beneficial effects that:

Compared with the prior art, firstly, by installing the solar cell string in the transparent box, on the one hand, the cell string is less prone to scratch, premature aging, damage and the like during use, thus playing a good role in protecting the cells, and on the other hand, it is beneficial for the cell string to better absorb light energy; secondly, the cell string is formed by connecting several N-type bi-facial monocrystalline silicon cells in series or in parallel and is vertically installed on the mounting base, so that both sides of the cell string can generate power, the generated output of the module can be improved, the power generation efficiency of the module per unit area can be improved, and the cost per kilowatt hour of the photovoltaic power generation can be effectively reduced.

BRIEF DESCRIPTION OF THE DRAWINGS

FIG. 3 is a structural diagram of N-type bi-facial monocrystalline silicon cells, in which:

1: transparent box; 2: cell string; 3: mounting base; 4: n-type bi-facial monocrystalline silicon cell; 5: positive terminal; 6: negative terminal; 7: positive wire; 8: negative wire; 9: strip-shaped slot; 10: extractor vent; 11: n-type monocrystalline silicon wafer; 12: n+ type crystalline silicon layer; 13: front passivation anti-reflection layer; 14: front metal electrode; 15: p++ type silicon film layer; 16: n++ type silicon film layer; 17: back passivation anti-reflection layer; 18: back metal electrode; 19: light guide; 20: bare optical fiber tube bundle; 21: reflective film.

DETAILED DESCRIPTION OF THE INVENTION

The present invention will be described in detail as below with reference to the accompanying drawings by the specific embodiments.

Figure 1:
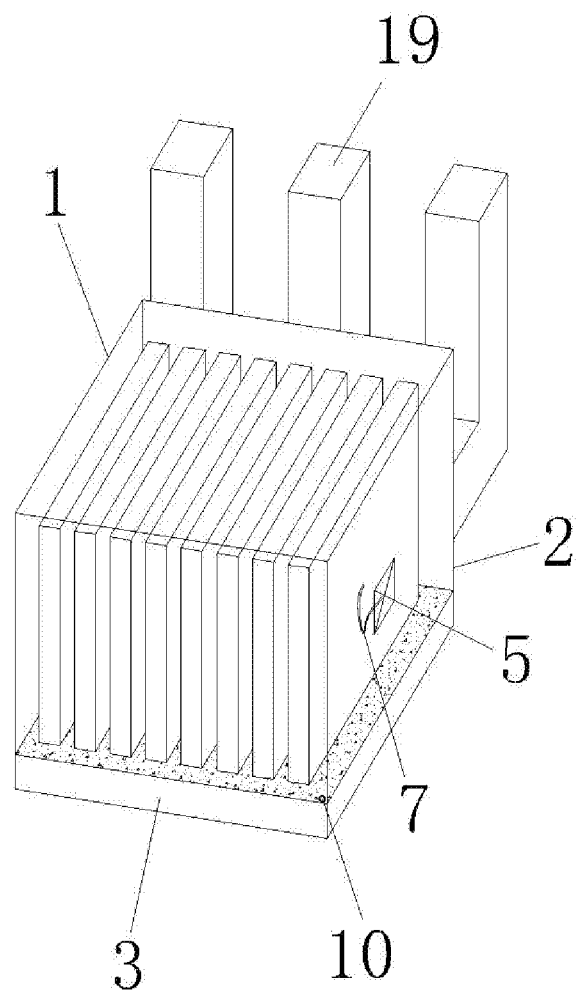
FIG. 1 is a structural diagram according to the present invention.
Figure 2:
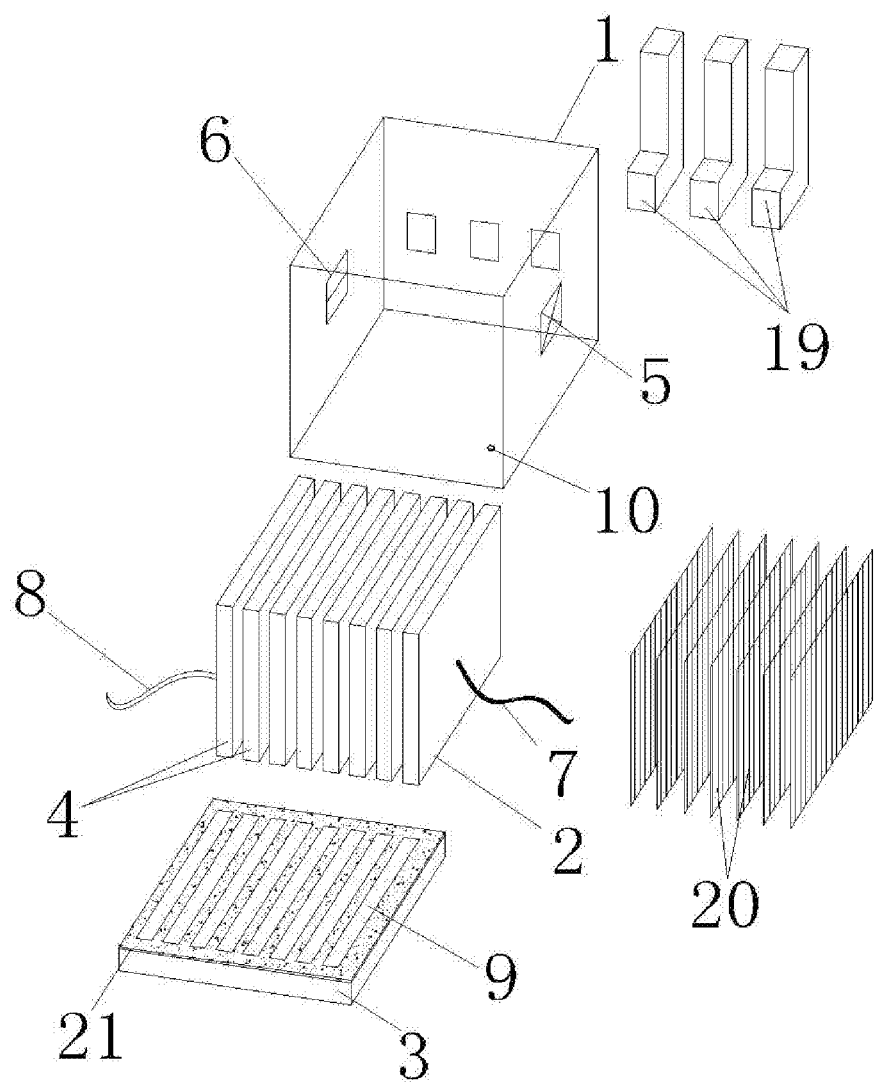
FIG. 2 is an exploded view according to the present invention.
Figure 3:
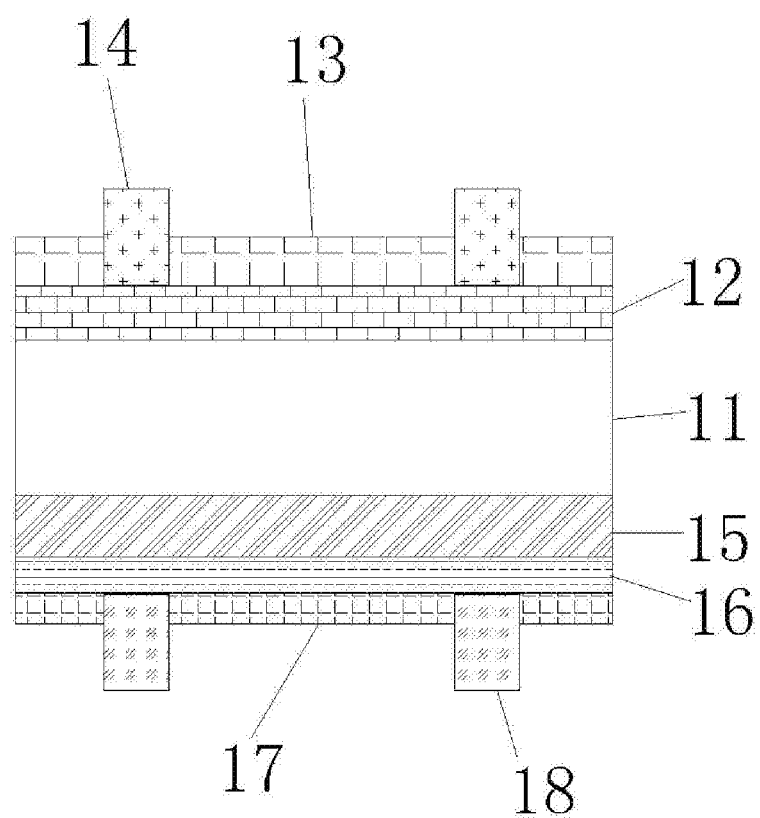

Referring to FIG. 1 to FIG. 3, The present invention relates to a bi-facial photovoltaic power generation module, including a transparent box 1, and a cell string 2 and a mounting base 3 which are installed inside the transparent box 1, wherein the transparent box 1 is internally provided with a positive terminal 5 and a negative terminal 6 passing through two side faces of the transparent box 1, respectively, the cell string 2 is formed by connecting several N-type bi-facial monocrystalline silicon cells 4 in series or in parallel, with one end of the cell string 2 connected to a positive wire 7 and the other end thereof connected to a negative wire 8; the positive wire 7 is welded on the positive terminal 5 and the negative wire 8 is welded on the negative terminal 6; and the mounting base 3 is provided with several parallel strip-shaped slots 9 in which the N-type bi-facial monocrystalline silicon cells 4 are vertically plugged.

Compared with the prior art, firstly, by installing the solar cell string 2 in the transparent box 1, on the one hand, the cell string 2 is less prone to scratch, premature aging, damage and the like during use, thus playing a good role in protecting the cells, and on the other hand, it is beneficial for the cell string 2 to better absorb light energy; secondly, the cell string 2 is formed by connecting several N-type bi-facial monocrystalline silicon cells 4 in series or in parallel and is vertically installed on the mounting base 3, so that both sides of the cell string 2 can generate power, the generated output of the module can be improved, the power generation efficiency of the module per unit area can be improved, and the cost per kilowatt hour of photovoltaic power generation can be effectively reduced.

In this embodiment, the transparent box 1 is made of tempered glass.

With the above solution, since the transparent box 1 is made of tempered glass, on the one hand, the cell string 2 is less prone to scratch, premature aging, damage and the like during use, the surface hardness of the transparent box 1 is large, the scratch resistance and compression resistance effect are good, thus playing a good role in protecting the cell string 2; on the other hand, the cell string 2 is arranged inside the transparent box made of tempered glass, it is beneficial for solar panel to better absorb light energy. It also plays a role in protecting the cell string 2, has a long service life, and prevents the battery string 2 from being damaged, etc.

In this embodiment, the transparent box 1 is provided with an extractor vent 10 connected to an air extractor.

With the above solution, the air extractor can extract air from the transparent box 1 through the extractor vent 10, so that a vacuum state can be maintained inside the transparent box 1, and the gas explosion generated due to high temperature of the internal cell string 2 can be effectively prevented.

In this embodiment, a transparent self-cleaning coating layer is coated on each outer surface of the transparent box 1.

With the above solution, the transparent box 1 has a self-cleaning function by coating a transparent self-cleaning coating layer on the outer surface of the transparent box 1, so that the transparent box 1 can be kept in a transparent and clean state for a long time, the repair and maintenance frequency is reduced, and the service life the transparent box 1 is prolonged.

In this embodiment, a space between the strip-shaped slots 9 is 2 mm.

With the above solution, a space of 2 mm can not only maintain good contact between two adjacent N-type bi-facial monocrystalline silicon cells 4, but also ensure that the sun irradiates the N-type bi-facial monocrystalline silicon cells 4 at different irradiation angles all day long without being affected by the shielding of the adjacent N-type bi-facial monocrystalline silicon cells 4, thereby improving power generation efficiency.

In this embodiment, several L-shaped light guides 19, of which an opening at one end faces upward and an opening at the other end thereof is fixedly connected to a side face of the transparent box 1, are arranged on the side surface of the transparent box 1.

With the above solution, the solar ray can be introduced into the transparent box 1 through the light guide 19, thus increasing the ray catching rate of the transparent box 1, further increasing the generating capacity of the N-type bi-facial monocrystalline silicon cells 4 and also making up for the defect that supplementary lighting cannot be made on the night side.

In this embodiment, a bare optical fiber tube bundle 20 which consists of several bare optical fiber tubes with a diameter of 0.2-2 mm is also arranged between the N-type bi-facial monocrystalline silicon cells 4; the bare optical fiber tubes are vertically fixed on the mounting base 3, and a layer of reflective film 21 is arranged on an upper surface of the mounting base 3.

With the above solution, the solar ray is introduced into the transparent box 1 through the light guides 19 and absorbed by the N-type bi-facial monocrystalline silicon cells 4 after multiple supplementary lighting by the bare optical fiber tube bundle 20 and the reflective film 21, so that the generating capacity can be increased by 5%.

In this embodiment, each N-type bi-facial monocrystalline silicon cell 4 includes an N-type monocrystalline silicon wafer 11, having an n+ type crystalline silicon layer 12, a front passivation anti-reflection layer 13, and a front metal electrode 14 which is in contact with the n+ type crystalline silicon layer 12 after penetrating the front passivation anti-reflection layer 13 successively superposed on a front side thereof from inside to outside, and a p++ type silicon film layer 15, an n++ type silicon film layer 16, a back passivation anti-reflection layer 17, and a back metal electrode 18 which is in contact with the n++ type silicon film layer 16 after penetrating the back passivation anti-reflection layer 17 successively superposed on a back side thereof from inside to outside.

With the above solution, firstly, each cell adopts the N-type monocrystalline silicon wafer 11 with a resistivity of 0.3-10Ω and a thickness of 50-500 microns as a substrate, which is used for absorbing photons and generating photo-induced carriers; secondly, its back side adopts a heterojunction emitter formed by the p++ type silicon film layer 15 and the N-type monocrystalline silicon wafer 11, so that it has a lower recombination current density. Finally, the n++ type silicon film layer 16 can not only form a composite tunneling junction with the p++ type silicon film layer 15 to effectively transmit photo-generated current, but also form a good ohmic contact directly with the metal back electrode.

As a preferred embodiment of the present invention, when the bottom area of the transparent box 1 is 1 square meter, 2000 N-type bi-facial monocrystalline silicon cells 4 can be fixedly installed on the mounting base 3. In this case, the generated output of the N-type bi-facial monocrystalline silicon photovoltaic power generation module can reach 7000-8000 watts compared with that of the traditional photovoltaic module of only 200 watts per square meter, so the present invention obviously greatly improves the power generation efficiency of the module per unit area.

The above embodiments merely describe the preferred embodiments of the present invention, and are not intended to limit the scope of the present invention. Without departing from the spirit of the present invention, various modifications and improvements made by a person of ordinary skill in the art to the technical solution of the present invention shall all fall within the protection scope defined by the claims of the present invention.

What is claimed is:

1. A bi-facial photovoltaic power generation module, comprising a transparent box, and a cell string and a mounting base which are installed inside the transparent box, wherein the transparent box is internally provided with a positive terminal and a negative terminal passing through two side faces of the transparent box, respectively, the cell string is formed by connecting several N-type bi-facial monocrystalline silicon cells in series or in parallel, with one end of the cell string connected to a positive wire and the other end thereof connected to a negative wire; the positive wire is welded on the positive terminal and the negative wire is welded on the negative terminal; and the mounting base is provided with several parallel strip-shaped slots in which the N-type bi-facial monocrystalline silicon cells are vertically plugged.

2. The bi-facial photovoltaic power generation module according to claim 1, wherein the transparent box is made of tempered glass.

3. The bi-facial photovoltaic power generation module according to claim 1, wherein the transparent box is provided with an extractor vent connected to an air extractor.

4. The bi-facial photovoltaic power generation module according to claim 1, wherein a transparent self-cleaning coating layer is coated on each outer surface of the transparent box.

5. The bi-facial photovoltaic power generation module according to claim 1, wherein a space between the strip-shaped slots is 2 mm.

6. The bi-facial photovoltaic power generation module according to claim 1, wherein several L-shaped light guides, of which an opening at one end faces upward and an opening at the other end thereof is fixedly connected to a side face of the transparent box, are arranged on the side surface of the transparent box.

7. The bi-facial photovoltaic power generation module according to claim 6, wherein a bare optical fiber tube bundle which consists of several bare optical fiber tubes with a diameter of 0.2-2 mm is also arranged between the N-type bi-facial monocrystalline silicon cells, and the bare optical fiber tubes are vertically fixed on the mounting base.

8. The bi-facial photovoltaic power generation module according to claim 6, wherein a layer of reflective film is arranged on an upper surface of the mounting base.

9. The bi-facial photovoltaic power generation module according to claim 1, wherein each N-type bi-facial monocrystalline silicon cell comprises an N-type monocrystalline silicon wafer, having an n+ type crystalline silicon layer, a front passivation anti-reflection layer, and a front metal electrode which is in contact with the n+ type crystalline silicon layer after penetrating the front passivation anti-reflection layer successively superposed on a front side thereof from inside to outside, and a p++ type silicon film layer, an n++ type silicon film layer, a back passivation anti-reflection layer, and a back metal electrode which is in contact with the n++ type silicon film layer after penetrating the back passivation anti-reflection layer successively superposed on a back side thereof from inside to outside.

* * * * *